United States Patent [19]

Chemans et al.

[11] Patent Number: 4,923,561
[45] Date of Patent: May 8, 1990

[54] CRYSTAL GROWTH METHOD

[75] Inventors: Jim E. Chemans, Trenton; Eric M. Monberg, Princeton, both of N.J.

[73] Assignee: American Telephone and Telegraph Company, New York, N.Y.

[21] Appl. No.: 248,530

[22] Filed: Sep. 23, 1988

[51] Int. Cl.$^5$ .................. C30B 11/02; C30B 35/00
[52] U.S. Cl. .................. 156/616.4; 156/620.70; 156/DIG. 70; 156/DIG. 81
[58] Field of Search ............. 156/616.4, 616.2, 620.70, 156/DIG. 70, DIG. 81, DIG. 83, DIG. 89, DIG. 98, DIG. 99, 624; 422/248; 373/163, 156

[56] References Cited

U.S. PATENT DOCUMENTS

| 4,265,661 | 5/1981 | Ware | 156/616.2 |
| 4,404,172 | 9/1983 | Gault | 156/616.2 |
| 4,528,061 | 7/1985 | Miyazawa et al. | 156/620.2 |

FOREIGN PATENT DOCUMENTS 51-35600 10/1976 Japan .................. 156/DIG. 83

OTHER PUBLICATIONS

Finicle, R. L., "Union Carbide Technical Bulletin-Advanced Ceramics", 10-16-86.
B. A. Joyce, "Growth of Single Crystals of GaAs in Bulk and Thin Film Form", included in the book, *Crystal Growth* edited by B. R. Pamplin, Pergamon Press, 1975, pp. 157-184.
W. D. Lawson et al., "Semiconducting Compounds", included in the book, *The Art and Science of Growing Crystals,* edited by J. J. Gilman, John Wiley & Sons, New York, 1963, pp. 365-391.
J. B. Mullin et al., "Liquid Encapsulation Techniques: The Use of an Inert Liquid in Suppressing Dissociation during the Melt-Growth of InAs and GaAs Crystals", included in the *Journal of Physical Chem. Solids*, vol. 26, pp. 782-784, 1965.
*Crystal Growth,* B. R. Pamplin, Pergamon Press, 1975, p. 389.
"The Origins of Twinning in CdTe", A. W. Vere et al., *Journal of Electronic Materials,* vol. 12, No. 3, 1983, pp. 551-560.

Primary Examiner—Gary P. Straub
Assistant Examiner—M. Franklin
Attorney, Agent, or Firm—R. B. Anderson

[57] ABSTRACT

In a vertical gradient freeze (VGF) process for growing a large crystal of a Group III-V compound semiconductor in a pyrolytic boron nitride crucible (11), a major part of the inner surface of the crucible is first oxidized to form a boric oxide layer (12).

18 Claims, 3 Drawing Sheets

CRYSTAL GROWTH METHOD

BACKGROUND OF THE INVENTION

This invention relates to processes for growing large single crystal semiconductors and, more particularly, to processes for growing large single crystals of Group III-V semiconductor compounds.

One of the most significant developments in recent years in semiconductor technology has been the increased importance of compound semiconductors. Particularly significant are the Group III-V semiconductor compounds composed of elements of Groups III and V of the periodic table, such as gallium arsenide (GaAs) and indium phosphide (InP). Compound semiconductors are used in such devices as semiconductor lasers, light emitting diodes, microwave oscillators and amplifiers, high speed transistors, and various types of radiation detectors including infrared and visible light detectors. Group III-V semiconductors, particularly GaAs, are increasingly being used for memory and logic integrated circuits, because their higher electron drift velocities make possible faster speeds than comparable conventional devices of silicon.

Most such commercial use requires the growth of large single crystals of the semiconductor. Various methods have been proposed for growing large single-crystal ingots from which wafers can be cut for the subsequent fabrication of useful devices. One of the more promising methods for such crystal growth is the vertical gradient freeze (VGF) method, particularly the VGF method defined in the U.S. patent of W. A. Gault No. 4,404,172. According to this method, polycrystalline starting material is placed in a vertically extending crucible including a small cylindrical seed well portion at its bottom end which snugly contains a seed crystal. Initially, the starting material and a portion of the seed are melted. The power to the system is then reduced in such a manner that freezing proceeds vertically upwardly from the seed crystal. The major advantage of the VGF method is that crystals with very low dislocation densities can be produced using low thermal gradients and slow rates of cooling. One possible drawback to VGF growth is that the interaction of the melt with the crucible may lead to the introduction of dislocations or cause false grains to nucleate and spoil the single crystal.

It is well known that the III-V compounds tend to dissociate at higher temperatures, with the more volatile Group V element escaping into the vapor phase. Several approaches have been developed to prevent or retard this tendency. For example, in one approach to the growth of gallium arsenide, the more volatile arsenic component is prevented from escaping by providing a vapor pressure of arsenic vapor over the melt from a separately heated reservoir of arsenic within the sealed growth container. It is also known in the art that arsenic loss from the melt may be retarded with the use of any of various materials such as boric oxide ($B_2O_3$), barium chloride ($BaCl_2$), or calcium chloride ($CaCl_2$) which act as diffusion barriers. Such additives, having a lower density than the molten gallium arsenide, rise to the surface, encapsulate the melt, and, together with an inert gas pressure in the vessel, can contain the volatile arsenic vapors; see, for example, the paper "Growth of Single Crystals of GaAs in Bulk and Thin Film Form," by B. A. Joyce, included in the book "Crystal Growth," edited by B. R. Pamplin, Pergamon Press, 1975, pp. 157–184 at page 165.

Various attempts have been made over the years to grow III-V crystals by the VGF technique utilizing different crucible materials. See for example, the aforementioned Pamplin book at pp. 389–391. A significant limitation on the success of these efforts has been the physical and chemical interaction of the melt with the crucible wall. See, for example the aforementioned Pamplin book, p. 389, and "The Art and Science of Growing Crystals," J. J. Gilman, Ed., John Wiley & Sons, New York, 1963, at p. 366 and p. 390. It has proved difficult to reproducibly decouple this interaction in order to eliminate spurious polycrystalline growth that results.

SUMMARY OF THE INVENTION

In accordance with the invention, these interaction problems are significantly reduced in a VGF process which uses a boron nitride crucible. Prior to the growth of each ingot, a major part of the inner surface of the crucible is thermally oxidized so as to form a layer or boric oxide. The effectiveness of thermally grown boric oxide appears to result from a number of mechanisms, as will be explained later.

The features and advantages of the invention will be better understood from a consideration of the following detailed description taken in conjunction with the accompanying drawing.

DETAILED DESCRIPTION

Figure 1:
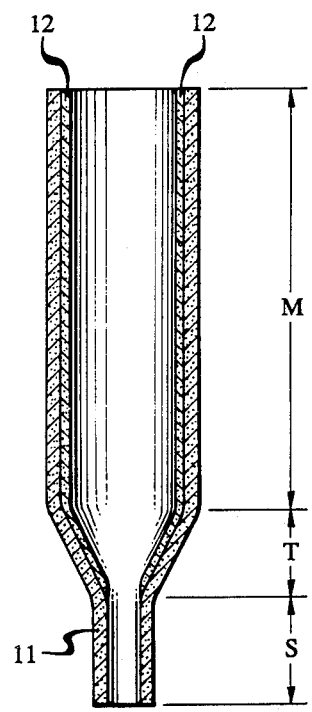
FIG. 1 is a sectional view of a crucible for growing a single-crystal ingot of compound semiconductor material in accordance with an illustrative embodiment of the invention.

Referring now to FIG. 1 there is shown a crucible 11 of the type used in the VGF process for growing large single crystals of compound semiconductors, particularly III-V semiconductors such as GaAs. The crucible 11 comprises a substantially cylindrical major portion M, a frusto-conical transition portion T, and a cylindrical seed well portion S, and is arranged vertically with the seed well portion at the bottom during crystal growth. As is described in detail in the aforementioned U.S. patent of W. A. Gault, No. 4,404,172 which is incorporated herein by reference, a cylindrical seed crystal is snugly fitted into the seed well portion S. Most of the remaining part of the crucible is then filled with a polycrystalline or amorphous form of the crystal to be grown, such as polycrystals of GaAs. The crucible is supported within an autoclave that includes a heater for melting the polycrystals and part of the seed crystal. In that case, for example, of GaAs, the autoclave also includes a portion for heating arsenic to provide an arsenic partial pressure at the top of the melt for helping to maintain the composition of the melt.

After all of the polycrystalline material and a portion of the seed has been melted, the power to the primary heater is reduced in order that the semiconductor solidifies on the remaining seed crystal and such solidification proceeds vertically upwardly. If the process proceeds as intended, the entirety of the molten gallium arsenide will solidify into a single crystal with a crystal orientation determined by that of the seed crystal. As described in the aforementioned patent, during cooling, there is a significant vertical temperature gradient in the crucible which is larger in the seed well portion S than in the transition portion T and larger in the transition portion than in the major portion M.

Unfortunately, workers in the art have found that a high proportion of the finished ingots contain dislocations or discontinuities in the crystal structure. We have observed that some of these defects appear to have originated at the outer periphery of the growing crystal. We have found that the incidence of such defects can be significantly reduced by thermally oxidizing the inner surface of the major portion M and the transition T of the crucible 11 so that a boric oxide layer 12 is formed on the inner surface of the crucible.

The crucible 11 is preferably made of pyrolytic boron nitride, a material that is known in the art for making such crucibles. The layer 12 can conveniently be made, as will be explained in more detail later, by heating the crucible while exposing its inner surface to oxygen. The oxygen will then react with boron nitride to form the thin, continuous, layer 12 of boric oxide ($B_2O_3$). To prevent crystal defects it is preferred that the boric oxide layer be at least 15 microns thick.

Although it is difficult to demonstrate conclusively the physical mechanisms responsible for the higher yield, it appears that the boric oxide layer 12 reduces defects for a combination of reasons. First, although each boron nitride crucible is made and maintained with as smooth an inner surface as possible, the thermal oxidation preferentially consumes or reduces small protuberances of the boron nitride that might otherwise constitute spurious crystal nucleation sites. Secondly, it is known that boric oxide tends to encapsulate the melt and keep it from wetting the sides of the crucible, and by using the continuous layer of thermally grown boron oxide, it is believed that this effect may be enhanced; that is, the uniform boric oxide coating more uniformly prevents interaction between the melt and the boric nitride crucible than would a boric oxide additive. Thirdly, the raw material placed in the crucible, e.g., GaAs polycrystals, may scratch or abrade the sidewalls of the crucible to create spurious nucleation sites. The boric oxide layer acts as a sacrificial protective coating. That is, if a portion of the coating is scratched and abraded away during the loading procedure, the particles and the scratched coating melt, and return the surface of the crucible to a smooth surface as the system is heated above 500° C. in the beginning phases of crystal growth.

As shown in FIG. 1, it is preferred that the formation of the oxide layer 12 be restricted to the major portion M and transition portion T. The diameter of the seed well portion S is carefully dimensioned so as to snugly contain the cylindrical seed crystal, and so diameter variations, as would result from oxidation of, and oxide accumulation on, the inner surface are to be avoided in the seed well portion.

After the process has been completed, the ingot is removed from the crucible. The removal process (typically including exposure to methanol and/or hot water) dissolves the boric oxide layer and causes exfoliation of boron nitride from the inner surface of the crucible. Thereafter, the crucible is cleaned and its inner surface is again thermally oxidized for further use. Since each oxide layer growth consumes a layer of boron nitride from the crucible, eventually the boron nitride crucible wall will be worn thin. Thus, by restricting thermal growth to the inner surface of the crucible, one extends the lifetime of each crucible.

Figure 2:
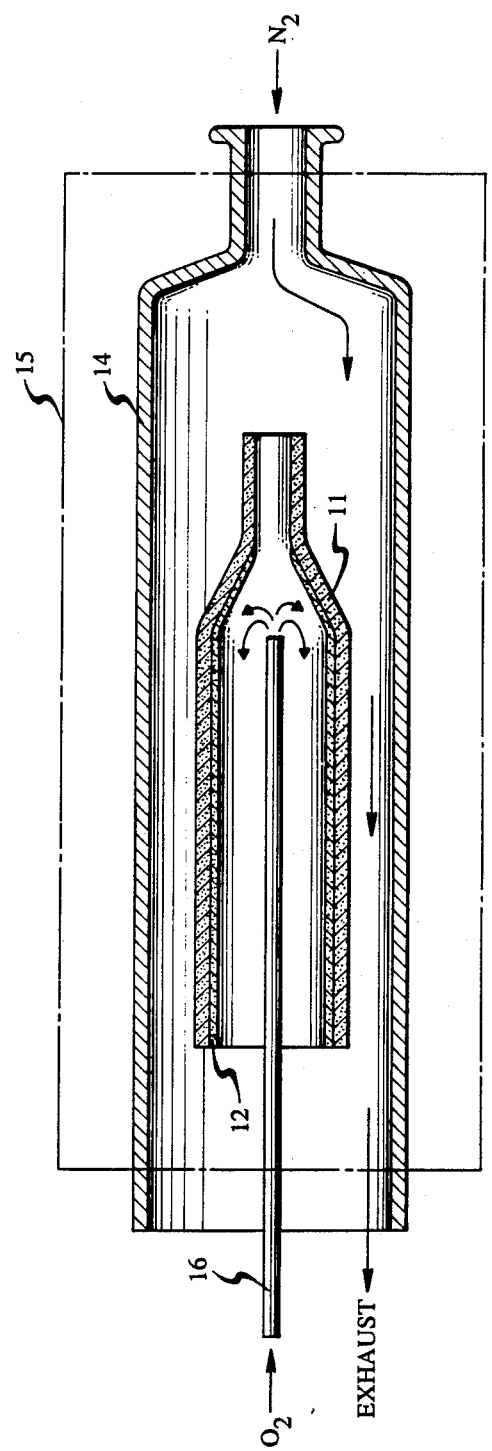
FIG. 2 is a sectional view of apparatus used to thermally oxidize part of a crucible in accordance with one embodiment of the invention.

FIG. 2 is an illustration of apparatus that has been used for the selective growth of the boric oxide layer in accordance with the invention. Crucible 11 is contained within a cylinder 14 which in turn is contained within a furnace 15. As the furnace heats the crucible, oxygen ($O_2$) is introduced into the interior of the crucible by a tubulation 16. Simultaneously, a counterflow of inert gas, such as nitrogen ($N_2$), is introduced into cylinder 14. The nitrogen thus enters the open end of the seed well portion of the crucible 11 so as to prevent oxygen from entering from the opposite end. Thus, both oxygen and nitrogen are expelled at the same end of the cylinder 14 as shown by the arrows that designate gas flow. By simple experimentation, one can quickly obtain a placement of tubulation 16 that, with an appropriate flow of nitrogen, gives thermal oxidation of the frustoconical transition portion without oxidizing the inner surface of the seed well portion of the crucible 11. The flow of nitrogen in cylinder 14 along the outer surface of crucible 11 prevents oxide growth on the outer surface of the crucible. For growth of a boric oxide layer 15 microns thick, the crucible was heated at 1050° C. for 18 hours while being exposed to $O_2$ flowing at a rate of 40 liters per hour (l/hr). The crucible dimensions were eleven inches in overall length; three inches inner diameter and eight inches in length of the major portion M; and 0.25 inches inner diameter and 1.5 inches in length of the seed well portion S. $N_2$ flowed over and through the crucible at a rate of 30 l/hr.

Figure 3:
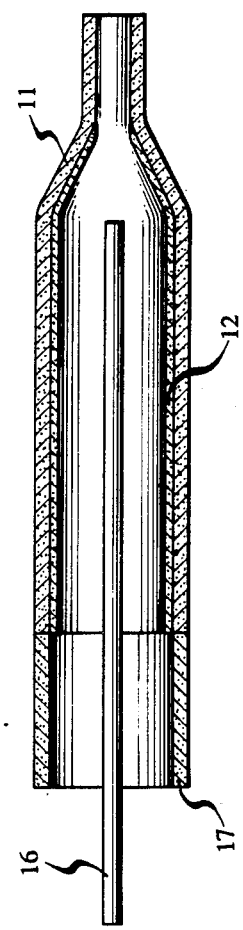
FIGS. 3 and 4 are sectional views of other apparatus that may be used for thermally oxidizing crucibles in accordance with other embodiments of the invention.

During growth of layer 12, the structures are preferably arranged in an axially symmetric environment, as shown in FIG. 2, to enhance uniformity. Nevertheless, it has been found that eddy currents of nitrogen sometimes occur around the large open end of the major portion of the crucible so as to reduce the thickness of the layer 12 at that end. Referring to FIG. 3, the effects of such eddy currents can conveniently be eliminated by abutting an annular member 17 against the open end of the major portion of the crucible 11. With an eleven inch long crucible, the annular member may have an axial length of three inches.

Figure 4:
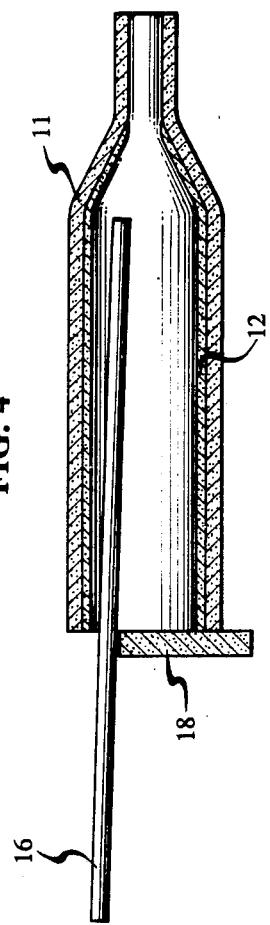

Referring to FIG. 4, an alternative solution to the nitrogen eddy current problem is the use of a cover plate 18 to cover the major part of the open end of the crucible 11. A sufficient opening should be maintained, however, to permit the exhausting of oxygen and nitrogen from the crucible, as explained before.

While we refer the invention as one for making large single crystals, it is to be understood that ingots containing more than one crystal grain may nevertheless be useful if single-crystal wafers can be cut from them. Use of the invention typically does not completely eliminate dislocations, but without the invention, local surface areas affected by the crucible may have dislocation densities so high as to make the ingot at that location polycrystalline. The invention is applicable to Group III-V compounds in general, such as gallium phosphide and indium antimonide, rather than being restricted to those specifically mentioned herein. Also, there are methods other than the VGF method for growing crystals in a crucible to which the invention would also be applicable. Various other embodiments and modifications may be made by those skilled in the art without departing from the spirit and scope of the invention.

We claim:

1. A process for making large single crystals of a material comprising the steps of introducing into a boron nitride crucible a relatively small monocrystalline seed crystal of the material and a quantity of the material in polycrystalline form, heating the crucible to melt the quantity of material, and freezing the material such that at least a major part of the frozen material extends as a single crystal from the seed crystal, characterized in that;

prior to the introduction of the quantity of polycrystalline material into the crucible, essentially all of that part of the inner surface of the crucible with which the quantity of material makes contact is reacted to form a layer of boric oxide.

2. The process of claim 1 further characterized in that the crucible is made of pyrolytic boron nitride, and the boric oxide substantially completely melts during the step of heating the crucible to melt the quantity of polycrystalline material.

3. The process of claim 2 further characterized in that the oxide layer is made by thermally oxidizing a major portion of the inner surface of the boron nitride crucible.

4. The process of claim 3 further characterized in that the crucible contains a seed well portion designed to hold the seed crystal, and steps are taken to assure that substantially no part of the seed well portion and substantially no part of the outer surface of the crucible are thermally oxidized.

5. The process of claim 4 further characterized in that the crucible comprises a substantially cylindrical major portion connected by a frusto-conical portion to the seed well portion, and the inner surface of the major portion and the frusto-conical portion are thermally oxidized by heating the crucible while using an oxygen-transmitting tube to expose selectively portions of the crucible to oxygen while directing inert gas over the outer surface of the crucible.

6. The process of claim 5 further characterized in that the oxygen-transmitting tube extends through an open end of the cylindrical major portion of the crucible and expels oxygen in the direction of the seed well portion, and part of the inert gas is directed into an open end of the cylindrical seed well portion to prevent oxidation of the inner surface of the seed well portion.

7. The process of claim 1 further characterized in that the material is a Group III-V compound material.

8. The process of claim 7 further characterized in that the material is gallium arsenide.

9. The process of claim 5 further characterized in that the process for making single crystals is a vertical gradient freeze process in which the crucible axis extends in the vertical direction with the seed well portion at the bottom thereof, and, during the freezing step, there are significant temperature gradients in the vertical direction in the seed well, the frusto-conical portion, and the major portion, the vertical temperature gradient is greater in the seed well portion than in the frusto-conical portion, and the vertical temperature gradient in the frusto-conical portion is greater than that in the major portion.

10. The process of claim 9 further characterized in that the material is a Group III-V compound material.

11. The process of claim 6 further characterized in that the inert gas is nitrogen gas, which is contained by a cylinder that surrounds the crucible during the thermal oxidation step, an annular element having the same diameter as the major portion of the crucible is abutted against the open-end of the major portion of the crucible during the thermal oxidation step.

12. The process of claim 6 further characterized in that a cover encloses most of the open-end of the major portion of the crucible during the thermal oxidation step.

13. A VGF process for making single crystals of a compound semiconductor comprising the steps of forming a crucible to have a seed well portion at a bottom end, a major cylindrical portion at a top end, and a transition portion between the seed well and major portions, introducing a monocrystalline seed crystal into the seed well portion, introducing a quantity of raw material into the major and transition portions of the cylinder, heating the crucible to melt the raw material and part of the seed crystal, and freezing the molten material by introducing temperature gradients in the vertical direction in the seed well, transition and major portions, the vertical temperature gradient being larger in the seed well portion than in the transition portion, the vertical temperature gradient in the transition portion being greater than in the major portion, and the temperature gradients being selected such as to cause progressive solidification of the material on the seed crystal in a vertically upward direction, characterized in that prior to the introduction of the quantity of raw material into the crucible, substantially all of that part of the inner surface of the crucible with which the quantity of raw material makes contact is reacted to form a layer of a boric oxide.

14. The process of claim 13 further characterized in that the compound semiconductor is a Group III-V compound.

15. The process of claim 14 further characterized in that the crucible is made of pyrolytic boron nitride, and the oxide layer is made by thermally oxidizing a major portion of the inner surface of the crucible.

16. The process of claim 15 further characterized in that steps are taken to assure that substantially no part of the seed well portion and substantially no part of the outer surface of the crucible are thermally oxidized.

17. The process of claim 16 further characterized in that the inner surface of the major portion and the inner surface of the transition portion are thermally oxidized by heating the crucible while using an oxygen-transmitting tube to expose selectively those inner surface portions of the crucible to oxygen.

18. The process of claim 17 further characterized in that the oxygen-transmitting tube extends through an open end of the major portion of the crucible and expels oxygen in the direction of the seed well portion, and inert gas is directed into an open end of the seed well portion and over the outer surface of the crucible so as to prevent oxidation of the inner surface of the seed well portion and the entire outer surface of the crucible.

* * * * *

UNITED STATES PATENT AND TRADEMARK OFFICE
CERTIFICATE OF CORRECTION

PATENT NO. : 4,923,561

DATED : May 8, 1990

INVENTOR(S) : J. E Clemans - E. M. Monberg

It is certified that error appears in the above—identified patent and that said Letters Patent is hereby corrected as shown below:

ON THE TITLE PAGE: Items [19] and [75]

two occurrences, change "Chemans" to --Clemans--.

Column 2, line 22, after "layer" change "or" to --of--, line 34, after "material" insert --made--, line 61, change "that" to --the--.

Signed and Sealed this

Tenth Day of September, 1991

Attest:

HARRY F. MANBECK. JR.

Attesting Officer

Commissioner of Patents and Trademarks